United States Patent
Tsuchida et al.

(10) Patent No.: US 10,297,998 B2
(45) Date of Patent: May 21, 2019

(54) ELECTRICAL JUNCTION BOX

(71) Applicants: AUTONETWORKS TECHNOLOGIES, LTD., Yokkaichi-shi, Mie (JP); SUMITOMO WIRING SYSTEMS, LIMITED, Yokkaichi-shi, Mie (JP); SUMITOMO ELECTRIC INDUSTRIES, LTD., Osaka-shi, Osaka (JP)

(72) Inventors: Toshiyuki Tsuchida, Yokkaichi (JP); Shigeki Yamane, Yokkaichi (JP); Hirotoshi Maeda, Yokkaichi (JP); Takuya Ota, Yokkaichi (JP); Junya Aichi, Yokkaichi (JP); Yoshihiro Tozawa, Yokkaichi (JP)

(73) Assignees: AUTONETWORKS TECHNOLOGIES, LTD., Mie (JP); SUMITOMO WIRING SYSTEMS, LIMITED, Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/075,890

(22) PCT Filed: Feb. 8, 2017

(86) PCT No.: PCT/JP2017/004529
§ 371 (c)(1),
(2) Date: Aug. 6, 2018

(87) PCT Pub. No.: WO2017/141784
PCT Pub. Date: Aug. 24, 2017

(65) Prior Publication Data
US 2019/0067925 A1    Feb. 28, 2019

(30) Foreign Application Priority Data
Feb. 18, 2016 (JP) ................. 2016-028627

(51) Int. Cl.
H05K 9/00 (2006.01)
H02G 3/16 (2006.01)
(Continued)

(52) U.S. Cl.
CPC ............... *H02G 3/16* (2013.01); *H01F 27/36* (2013.01); *H02G 3/03* (2013.01); *H02G 3/081* (2013.01);
(Continued)

(58) Field of Classification Search
CPC ............... H05K 9/0032; H05K 9/0037; H05K 2201/10371
See application file for complete search history.

(56) References Cited

U.S. PATENT DOCUMENTS

| | | | |
|---|---|---|---|
| 6,180,876 B1 * | 1/2001 | Holmes | H05K 9/0032 174/361 |
| 6,545,871 B1 * | 4/2003 | Ramspacher | H05K 7/20445 165/185 |

(Continued)

FOREIGN PATENT DOCUMENTS

| | | |
|---|---|---|
| JP | H06-338678 A | 12/1994 |
| JP | H07-245849 A | 9/1995 |

(Continued)

OTHER PUBLICATIONS

May 9, 2017 International Search Report issued in International Application No. PCT/JP2017/004529.

*Primary Examiner* — Hung V Ngo
(74) *Attorney, Agent, or Firm* — Oliff PLC

(57) ABSTRACT

An electrical junction box that includes a circuit board on which a coil element is installed; a partition wall that surrounds the coil element and separates an installation region on the circuit board on which the coil element is installed from a region around the installation region; a (Continued)

frame that is formed in one piece with the partition wall and surrounds the circuit board; a heat dissipation plate on which the circuit board and the frame are placed; and a cover that covers the circuit board from the frame side, wherein the coil element is fixed to the partition wall using a synthetic resin material, and wherein the frame and the heat dissipation plate are positioned relative to each other through a recess-projection engagement, and the cover is fixed to the heat dissipation plate using screws.

8 Claims, 13 Drawing Sheets

(51) Int. Cl.
      *H05K 1/18*       (2006.01)
      *H01F 27/36*     (2006.01)
      *H02G 3/03*      (2006.01)
      *H02G 3/08*      (2006.01)
      *H05K 1/02*      (2006.01)
      *B60R 16/023*    (2006.01)

(52) U.S. Cl.
      CPC ......... *H05K 1/0203* (2013.01); *H05K 1/0216* (2013.01); *H05K 1/184* (2013.01); *H05K 9/0032* (2013.01); *H05K 9/0037* (2013.01); *B60R 16/0239* (2013.01); *H05K 2201/066* (2013.01); *H05K 2201/1003* (2013.01); *H05K 2201/10371* (2013.01); *H05K 2201/10409* (2013.01); *H05K 2201/2018* (2013.01)

(56) References Cited

U.S. PATENT DOCUMENTS

| | | | |
|---|---|---|---|
| 9,089,046 B2* | 7/2015 | Chen | H01L 23/49805 |
| 9,144,183 B2* | 9/2015 | Chen | H05K 9/0007 |
| 9,179,538 B2* | 11/2015 | Foster | H05K 1/0218 |
| 9,781,819 B2* | 10/2017 | Strader | H05K 1/0203 |
| 9,924,616 B2* | 3/2018 | Song | H05K 9/0032 |
| 2002/0039667 A1 | 4/2002 | Takaya et al. | |
| 2015/0016066 A1 | 1/2015 | Shimamura et al. | |
| 2015/0048675 A1 | 2/2015 | Fujii et al. | |

FOREIGN PATENT DOCUMENTS

| | | |
|---|---|---|
| JP | H08-056067 A | 2/1996 |
| JP | 2001-284877 A | 10/2001 |
| JP | 2011-155223 A | 8/2011 |
| JP | 2011-254657 A | 12/2011 |
| JP | 2014-036058 A | 2/2014 |
| JP | 2015-089179 A | 5/2015 |

* cited by examiner

ELECTRICAL JUNCTION BOX

This application is the U.S. National Phase of PCT/JP2017/004529 filed Feb. 8, 2017, which claims priority to Japanese Patent Application No. 2016-028627 filed Feb. 18, 2016, the entire disclosure of which is incorporated herein by reference.

BACKGROUND

The technology disclosed in this specification relates to an electrical junction box.

A conventional electrical junction box including a case accommodating a circuit assembly in which various electronic components are installed on a conductive path of a circuit board is known as an apparatus for applying or interrupting an electric current to in-vehicle electrical equipment.

An example of the electronic components installed on a board in such an electrical junction box is a coil element such as an inductor obtained by winding a coil around a core. When a heavy electronic component such as a coil element is connected to the conductive path on the board only by soldering its terminals to the conductive path, there is a risk that cracks are formed in the solder due to the vibration during traveling. Therefore, the main body of the coil element is mechanically fixed to the board using a fixing means such as a screw or a leaf spring.

SUMMARY

However, a region for the fixation of a screw, a leaf spring, or the like needs to be separately provided on the board in order to mechanically fix the coil element using a screw, a leaf spring, or the like. In addition, there is a concern that stress caused by a fastening force is applied to a region around a screw on the board and causes a malfunction of a printed circuit or the like, and therefore, a circuit cannot be provided in the region around a screw. Specifically, such a fixing means prevents an increase in the density of the circuit board, and thus prevents a reduction in the size of an electrical junction box.

In addition, with such a fixing means, screws must be fastened in a narrow region, and therefore, a manufacturing operation is complicated.

An exemplary aspect of the disclosure provides a circuit assembly and an electrical junction box that are easily manufactured and can be reduced in size.

The technology disclosed in this specification is a circuit assembly including a circuit board on which a coil element is installed, and a partition wall that surrounds the coil element and separates an installation region on the circuit board on which the coil element is installed from a region around the installation region, wherein the coil element is fixed to the partition wall using a synthetic resin material.

With the above-mentioned configuration, the coil element is fixed to the partition wall using the synthetic resin material. Therefore, the region for the fixation of a screw need not be provided on the circuit board, and a conductive circuit such as a printed circuit can be arranged in a region around the coil element because stress caused by a fastening force is not applied to the circuit board, thus making it possible to increase the wiring density. That is, the size can be reduced.

In addition, for example, the partition wall needs only to be arranged surrounding the coil element on an installation region of the circuit board, and fixed to the coil element using the synthetic resin material, and therefore, the manufacturing operation can be easily performed.

The above-mentioned circuit assembly may have the configurations described below.

The synthetic resin material may be an adhesive for bonding the coil element to the partition wall.

The synthetic resin material may be a potting material in which at least a portion of the coil element is embedded.

With this configuration, the coil element is surrounded by the partition wall, and at least a portion of the coil element is embedded in the potting material provided in a space inward of the partition wall. Therefore, the coil element is firmly fixed to the circuit board.

A configuration in which an entirety of the coil element is embedded in the potting material is also possible. With this configuration, heat generated by the coil element is immediately transferred to the potting material and the partition wall and dissipated, thus making it possible to further improve a heat dissipating property compared with a configuration in which only a portion of the coil element is embedded in the potting material.

It should be noted that "the entirety is embedded" includes both a case where the coil element is completely covered to its top surface (a surface on a side opposite to the bottom surface facing the circuit board) with the potting material and a case where only the top surface is exposed from the potting material.

The potting material may contain magnetic metal powder. With this configuration, a portion of the magnetic field generated by the coil element can be blocked by the magnetic metal powder.

Moreover, the partition wall may be provided with a shielding layer. With this configuration as well, a portion of the magnetic field can be blocked.

A configuration in which a plurality of the coil elements are installed on the circuit board, and the partition wall surrounds the plurality of the coil elements all together in a state in which gaps are formed at least between the plurality of the coils is also possible.

With this configuration, the number of components can be reduced compared with a configuration in which each of the coil elements is surrounded by the partition wall. In addition, the manufacturing operation can be easily performed.

A bottom wall placed on the circuit board in the space inward of the partition wall may be formed in one piece with the partition wall. With this configuration, it is easy to fix the coil to a region inward of the partition wall in advance, and when a plurality of coils are provided, for example, the plurality of coils can be arranged all together on the circuit board in a state in which they are fixed to predetermined positions inward of the partition wall in advance.

Furthermore, a technology disclosed in this specification is an electrical junction box including the above-described circuit assembly, and a case in which the circuit assembly is accommodated, wherein the partition wall and a frame surrounding the circuit body are formed in one piece with the case.

With this configuration, when the case (frame) is assembled to a predetermined position, the partition wall is positioned automatically. In addition, the number of components can be reduced, and the manufacturing operation can be simplified.

With the technology disclosed in this specification, it is possible to provide a circuit assembly and an electrical junction box that are easily manufactured and can be reduced in size.

DETAILED DESCRIPTION OF EMBODIMENTS

Embodiment 1

Embodiment 1 will be described with reference to FIGS. 1 to 10. An electrical junction box 10 of this embodiment is arranged between a power source such as a battery and in-vehicle electrical equipment such as lamps and a motor, and applies or interrupts an electric current from the power source to the in-vehicle electrical equipment.

Figure 1:
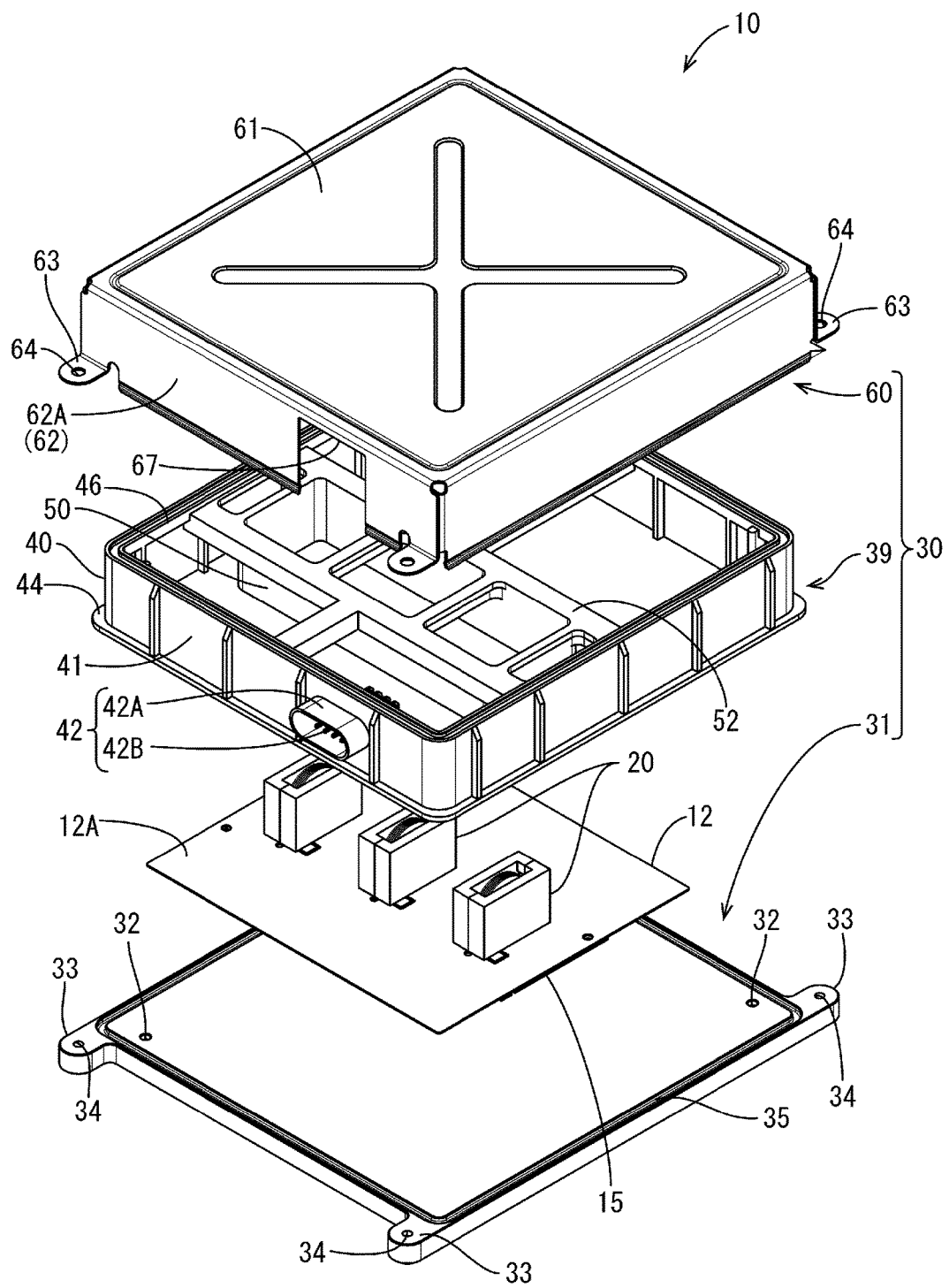
FIG. 1 is an exploded perspective view of an electrical junction box of Embodiment 1.
Figure 3:
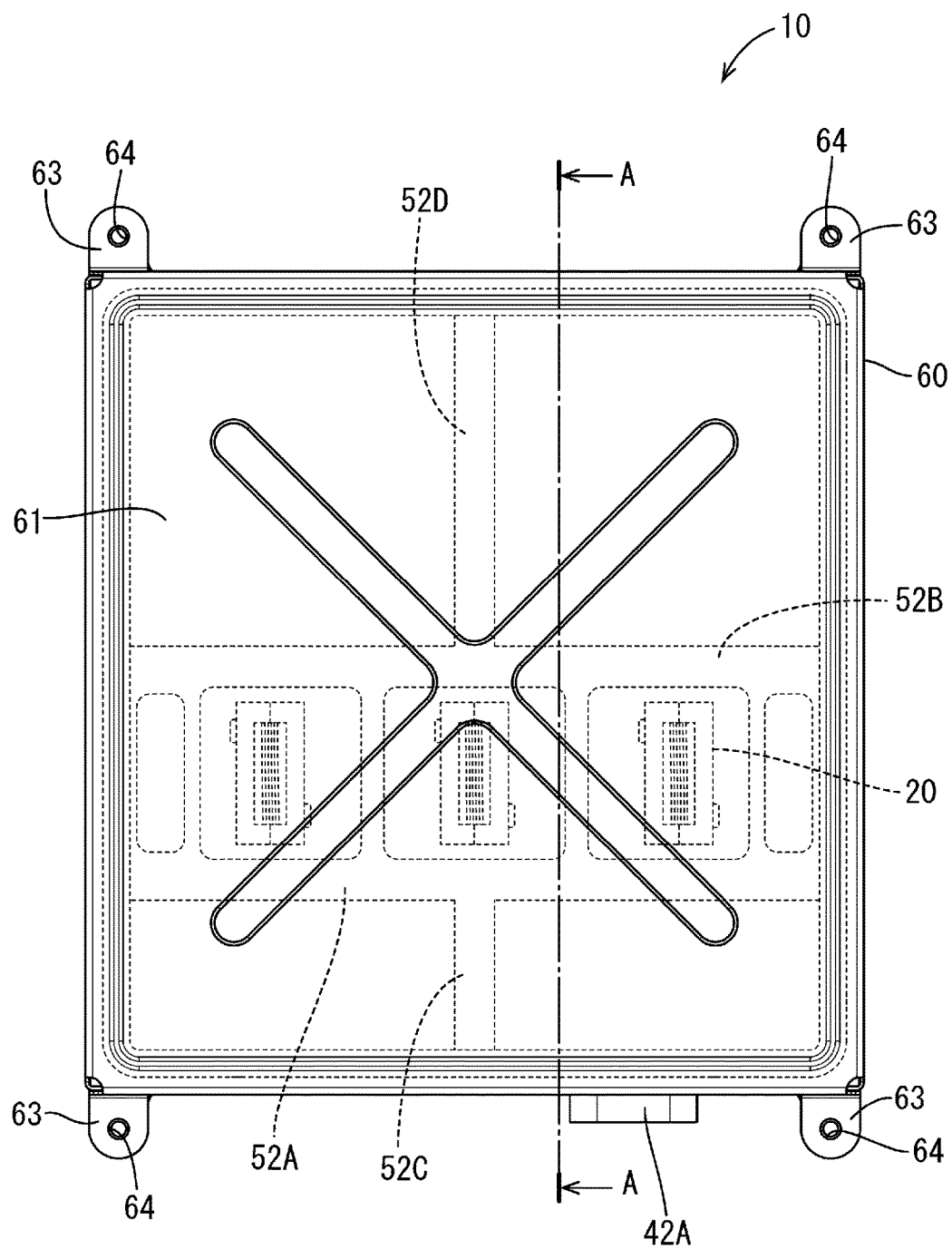
FIG. 3 is a plan view of the electrical junction box.
Figure 4:
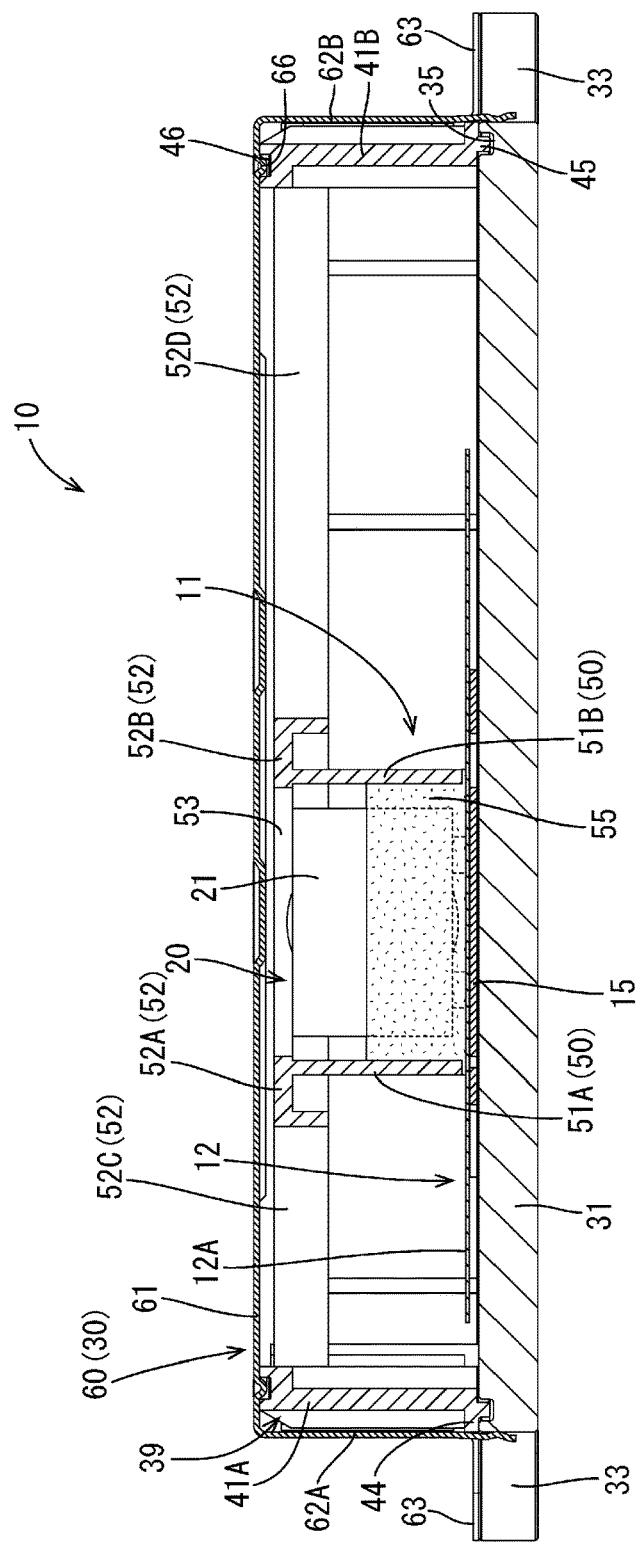
FIG. 4 is a cross-sectional view taken along line A-A in FIG. 3.

In the following description, the upper side in FIGS. 1 and 4 is taken as an "obverse side" or an "upper side", and the lower side is taken as a "reverse side" or a "lower side". In addition, the lower side in FIG. 3 is taken as a "front side (front)", and the upper side is taken as a "rear side (back)". The right side in FIG. 3 is taken as a "right", and the left side is taken as a "left".

Electrical Junction Box 10

As shown in FIG. 1, for example, the electrical junction box 10 includes a circuit assembly 11 including a circuit board 12 on which electronic components such as coils 20 are installed, and an outer case 30 in which the circuit assembly 11 is accommodated.

Circuit Board 12

In the circuit board 12, a printed circuit (not shown) is formed on the obverse side of an insulated board through printed wiring, and a plurality of busbars 15 are arranged in a predetermined pattern on the reverse side.

In this embodiment, only the coils 20 (as examples of coil elements), which are relatively large electronic components of the plurality of electronic components, are shown, and the other electronic components are omitted. A surface (surface on the obverse side) of the circuit board 12 on which the coils 20 are installed is referred to as "installation surface 12A".

The circuit board 12 has a substantially rectangular shape, and is provided with a plurality of connection holes 13 at predetermined positions. These connection holes 13 are used to install the coils 20 on the busbars 15 (see FIG. 5).

Figure 5:
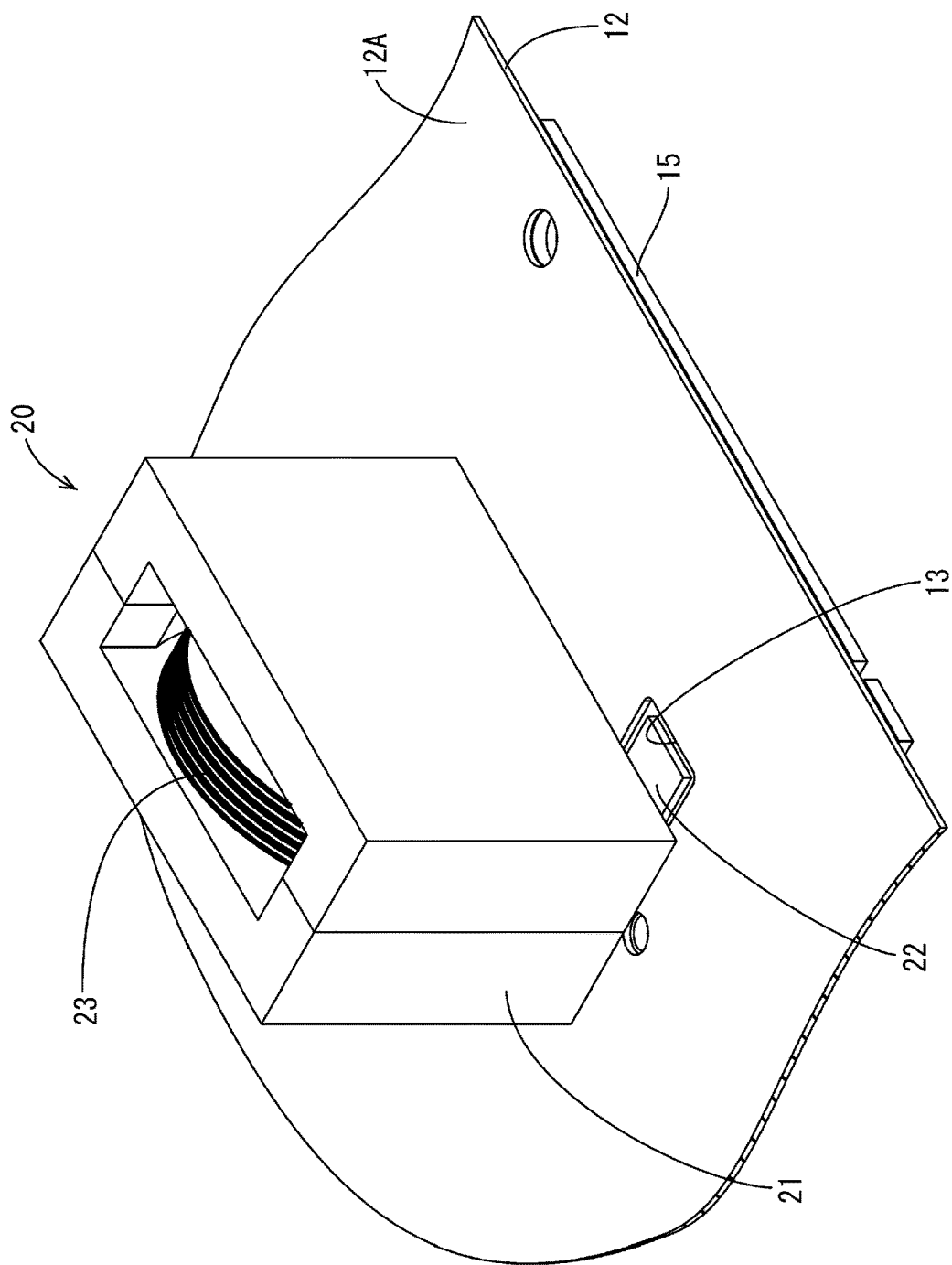
FIG. 5 is an enlarged perspective view of a coil installed on a circuit board.
Figure 6:
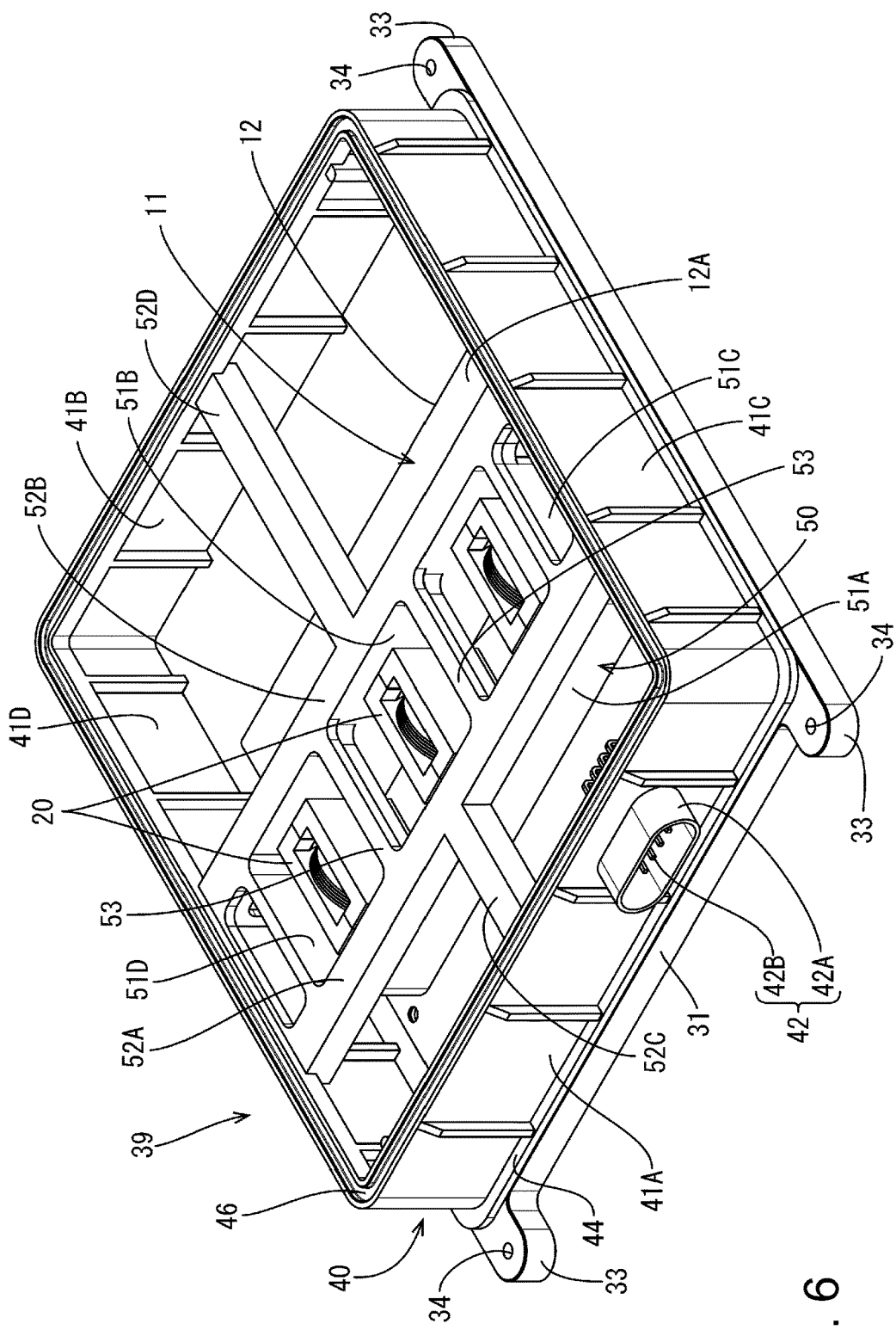
FIG. 6 is a perspective view of the electrical junction box in a state in which a shielding cover is removed.

As shown in FIG. 5, each of the coils 20 used in this embodiment includes a main body 21 that has a substantially rectangular parallelepiped shape and that includes a wound portion 23 obtained by winding a flat wire in an edgewise manner, and has a configuration in which a pair of flat connection portions 22 (both ends of the flat wire) protrudes downward in an L-shape from the bottom of the main body 21. The axis of the wound portion 23 extends in a direction along the circuit board 12 (i.e., a direction parallel to the circuit board 12), and therefore, the coil 20 is of the so-called vertical type. The coil 20 is electrically connected to the busbar 15 by soldering the connection portions 22 to portions of the surface of the busbar 15 that are exposed through the connection holes 13, for example.

Figure 7:
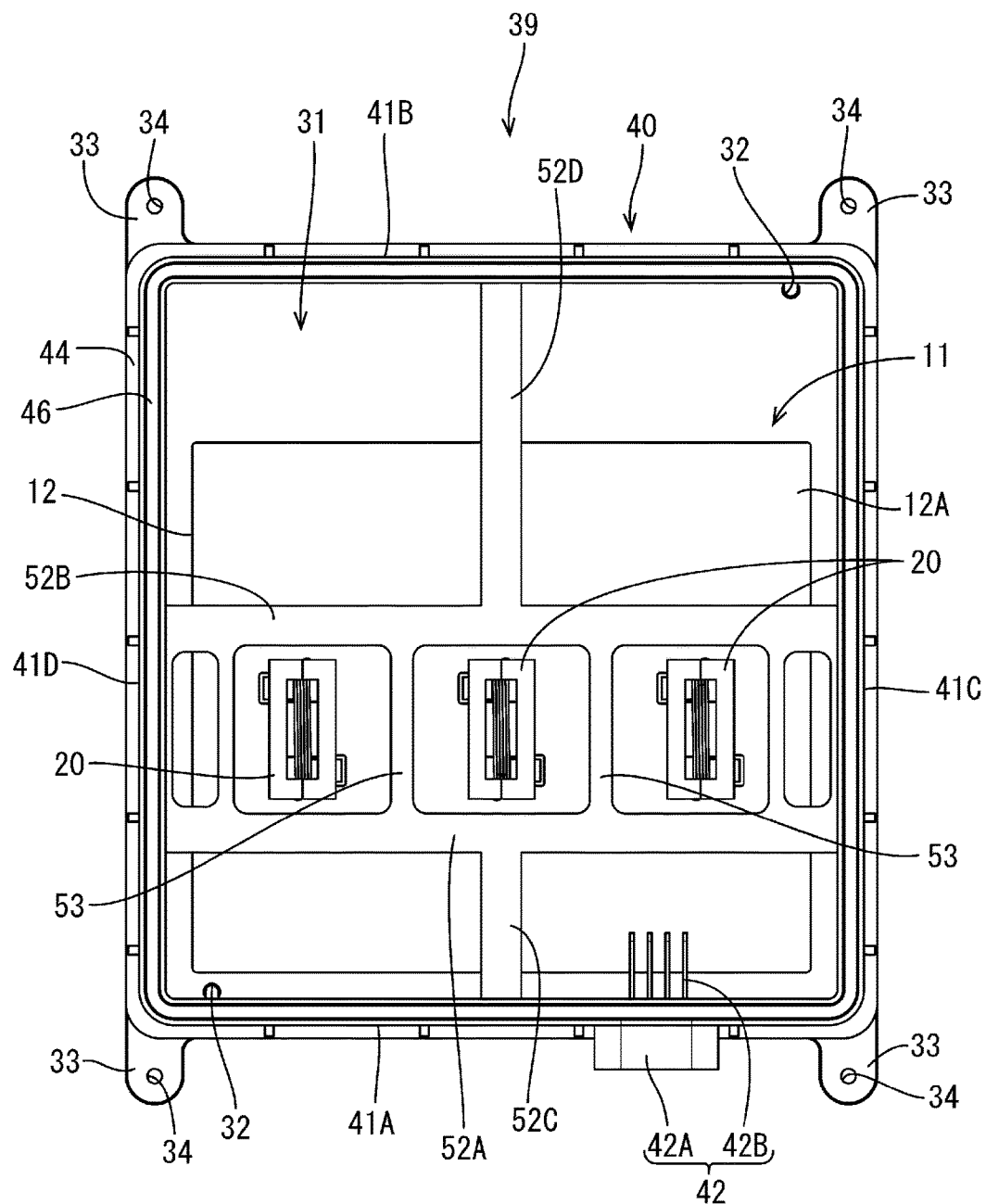
FIG. 7 is a plan view of the electrical junction box in a state in which the shielding cover is removed.

In this embodiment, three coils 20 are arranged adjacently and are aligned in a row on the circuit board 12 with their axes being identical (see FIG. 7).

Outer Case 30

The above-described circuit board 12 is accommodated in the outer case 30. As shown in FIG. 1, the outer case 30 includes a rectangular flat heat dissipation plate 31 arranged on the lower side (side opposite to the installation surface 12A) of the circuit board 12, an inner case 39 (as an example of a case) including a substantially rectangular frame-shaped frame 40 (as an example of a frame member/frame) surrounding the circuit board 12, and a shielding cover 60 covering the circuit board 12 positioned on the heat dissipation plate 31 from above the frame 40 (inner case 39).

Heat Dissipation Plate 31

The heat dissipation plate 31 is made of a metal material such as aluminum or an aluminum alloy that has a good thermal conductivity, and has a function of dissipating heat generated by the circuit board 12 (circuit assembly 11).

Positioning holes 32 for positioning the frame 40 on the heat dissipation plate 31 are provided near a front-left edge portion and a rear-right edge portion on the upper side of the heat dissipation plate 31.

Both ends in the left-right direction of the heat dissipation plate 31 are provided with a total of four heat dissipation plate-side fixation pieces 33 extending in the front-rear direction (vertical direction in FIG. 7). Heat dissipation plate-side fixation holes 34 for the fixation to the shielding cover 60, which will be described later, penetrate the heat dissipation plate-side fixation pieces 33.

A heat dissipation plate-side groove 35 is provided near the edge of the upper side of the heat dissipation plate 31, the heat dissipation plate-side groove extending along the edge in an annular manner and being recessed downward from the upper side of the heat dissipation plate 31. A frame-side rib 45 of the frame 40, which will be described later, is fitted into the heat-dissipation plate-side groove 35 (see FIG. 4).

It should be noted that, although not shown in the diagrams, an insulating sheet for achieving the insulation between the heat dissipation plate 31 and the circuit board 12 (busbars 15) is placed on the upper side of the heat dissipation plate 31. The insulating sheet has such adhesiveness that it can be fixed to the busbars 15 and the heat dissipation plate 31.

Inner Case 39

The inner case 39 is made of a synthetic resin, and includes the frame 40 in which the above-described circuit board 12 (circuit assembly 11) is accommodated, and a partition wall 50.

The frame 40 has a substantially rectangular frame shape that surrounds the circuit board 12 (circuit assembly 11), and a connector portion 42 for connecting the circuit board 12 to an external terminal (not shown) is provided in a front wall 41A of four lateral walls 41, which is located on the front side. The connector portion 42 includes a tubular connector hood portion 42A protruding frontward and a plurality of tab-shaped male terminals 42B that are provided inside the connector hood portion 42A and pass through an inner wall.

Figure 10:
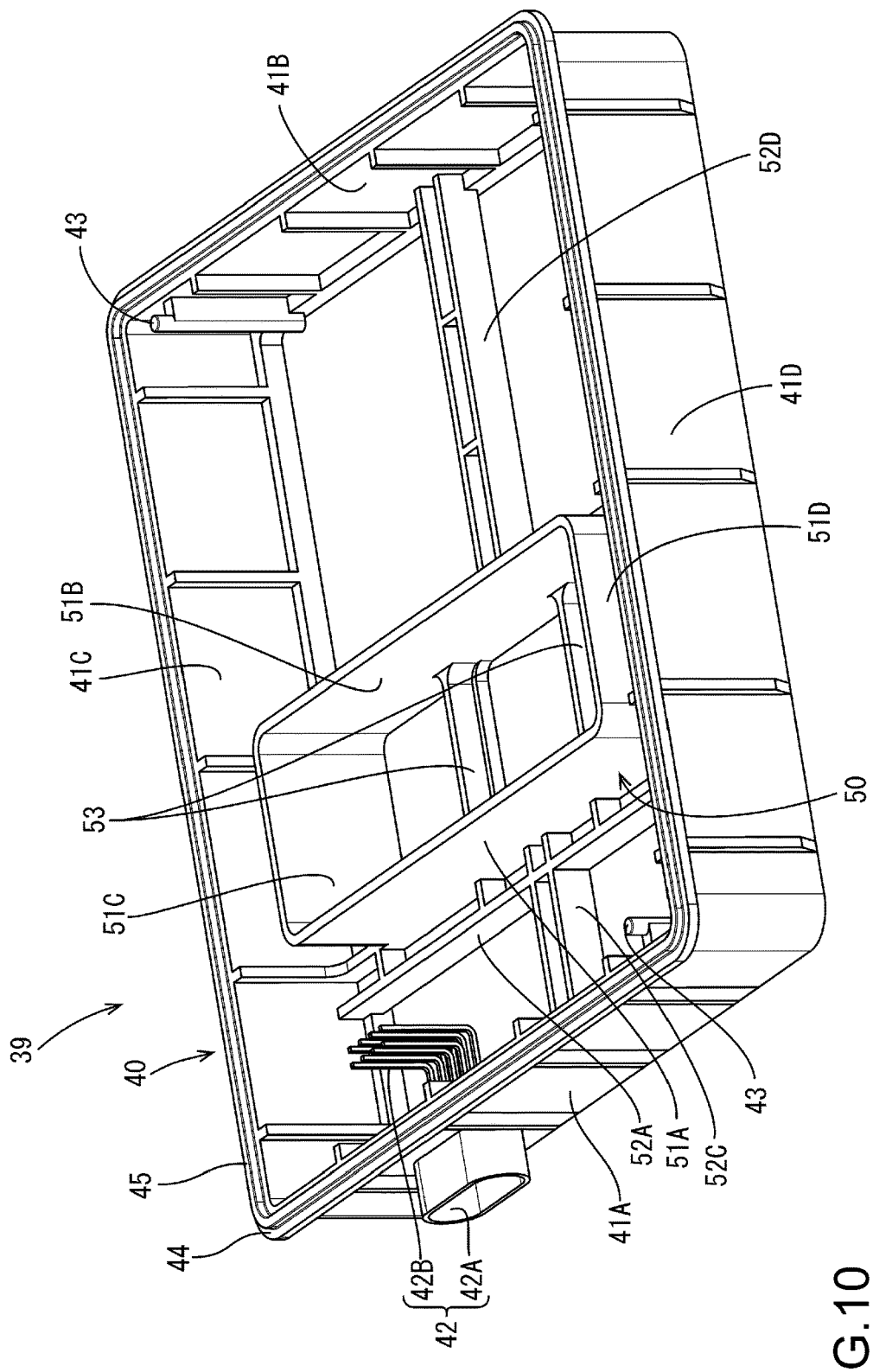
FIG. 10 is a perspective view showing a lower side of the inner case.

Positioning protrusions 43 are provided near a front-left edge portion and a rear-right edge portion of the frame 40, and are fitted into the above-described positioning holes 32 of the heat dissipation plate 31 when the frame 40 is placed at a predetermined position on the heat dissipation plate 31 (see FIG. 10). The positioning protrusions 43 are formed by protruding the lower end portions (upper end portions in FIG. 10) of projections that project inward from the lateral walls 41 of the frame 40, downward (upward in FIG. 10) into a protruding shape.

A flange portion 44 projecting outward is provided at the lower edge of the frame 40, and a frame-side rib 45 extending in an annular manner that is to be fitted into the heat dissipation plate-side groove 35 protrudes downward from the central portion of the flange portion 44 in the width direction (see FIGS. 4 and 10).

Furthermore, a frame-side groove 46 that is recessed downward and into which a coverside rib 66 of the shielding cover 60, which will be described later, is to be fitted is provided on the upper end surface of the frame 40 (see FIGS. 4 and 8).

The frame 40 and the partition wall 50 are formed in one piece with the inner case 39 of this embodiment. The partition wall 50 has a quadrilateral tube shape that surrounds the main bodies 21 of the three coils 20 arranged on the circuit board 12 all together in a state in which gaps are formed between the coils 20. Four wall portions 51 included in the partition wall 50 are arranged such that gaps are formed between the wall portions 51 and the outer surfaces of the coils 20 (main bodies 21). The heights of the wall portions 51 are set to be slightly larger than the heights of the coils 20 from the installation surface 12A and smaller than the heights of the lateral walls 41 of the frame 40 (see FIG. 4).

The partition wall 50 is integrated with the frame 40 via bridge portions 52 connecting portions near the upper end of the frame 40, and is arranged at a predetermined position inward of the frame 40. The bridge portions 52 have a channel structure having a U-shaped cross section that is open downward (see FIG. 4).

Figure 8:
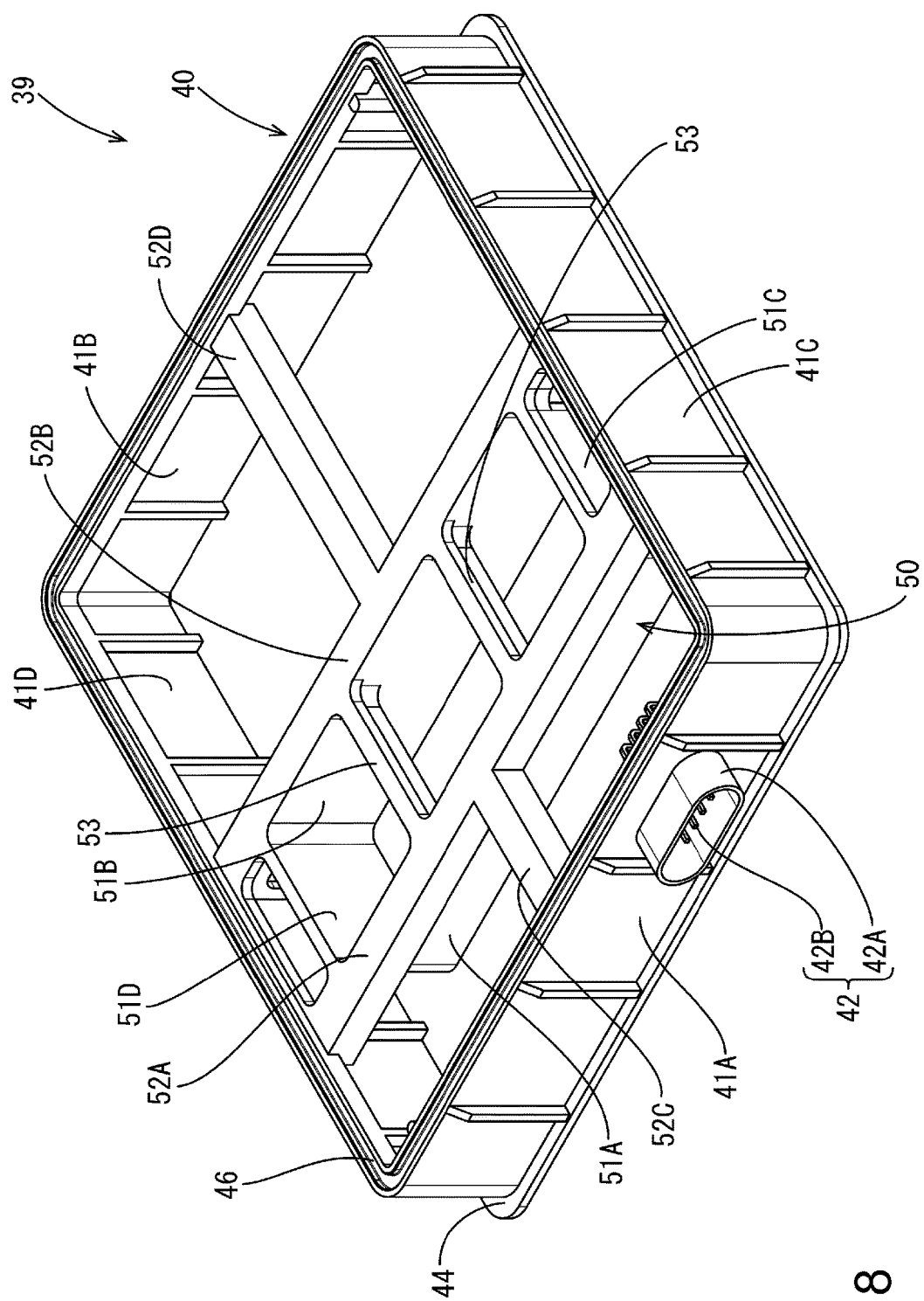
FIG. 8 is a perspective view of an inner case.
Figure 9:
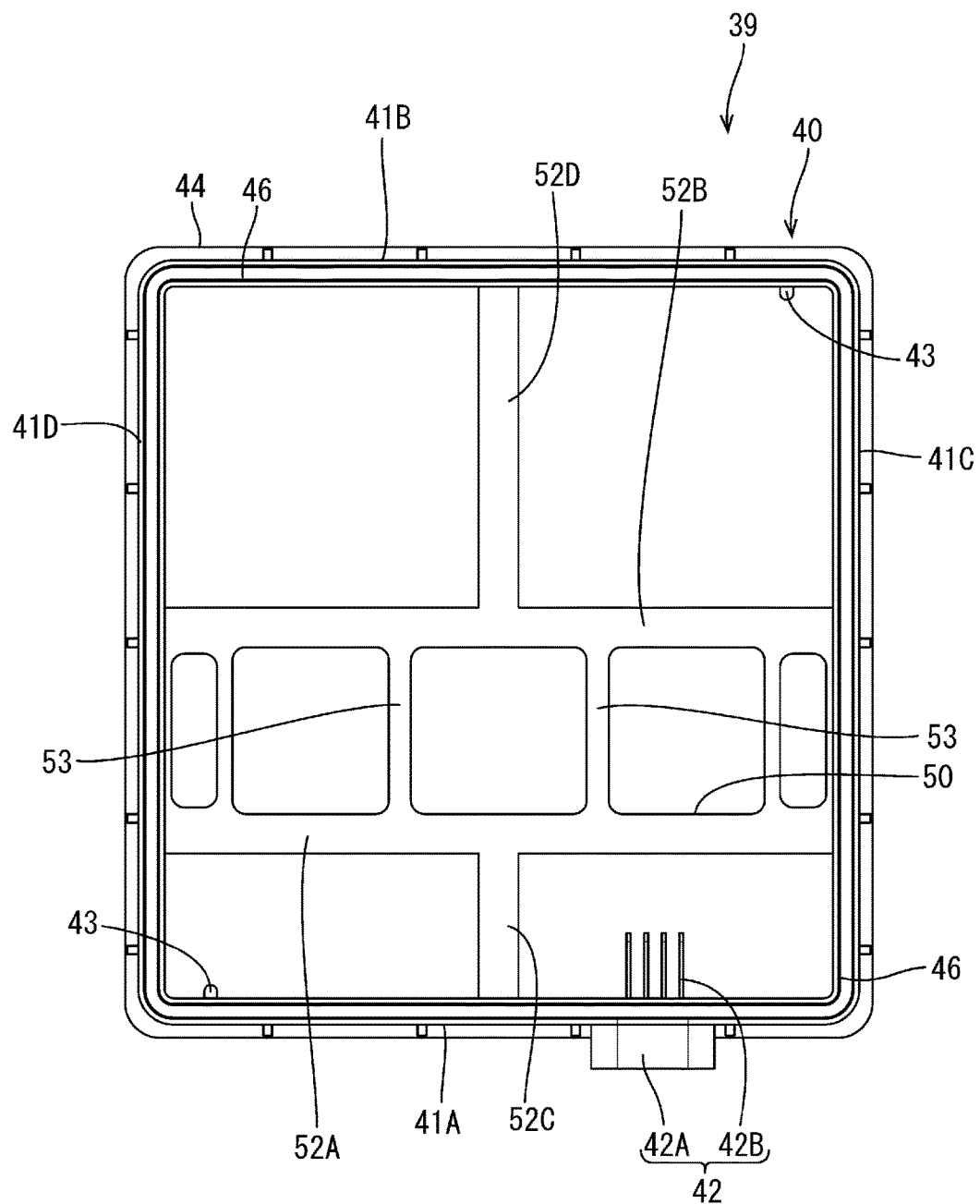
FIG. 9 is a plan view of the inner case.

More specifically, as shown in FIGS. 7 and 8, the frame 40 is provided with a pair of bridge portions 52 (namely a front lateral bridge portion 52A and a rear lateral bridge portion 52B) connecting a right wall 41C and a left wall 41D (in the left-right direction), and a front wall 51A and a rear wall 51B of the four wall portions 51 of the partition wall 50 respectively extend from one end of the lateral bridge portion 52A and one end of the lateral bridge portion 52B (these ends are located close to each other) (see FIG. 4).

The central portions in the left-right direction of the upper ends of the front wall 51A and the rear wall 51B of the partition wall 50 are respectively connected to a front longitudinal bridge portion 52C connecting the front wall 41A of the frame 40 and the front lateral bridge portion 52A, and a rear longitudinal bridge portion 52D connecting the rear wall 41B of the frame 40 and the rear lateral bridge portion 52B. The partition wall 50 is connected to these bridge portions 52A, 52B, 52C, and 52D, and is thus held at a predetermined position inward of the frame 40.

A pair of reinforcing portions 53 connecting the upper ends of the front wall 51A and the rear wall 51B is provided inward of the partition wall 50. These reinforcing portions 53 are provided at positions that trisect the length in the left-right direction of the partition wall 50.

With this configuration, in a state in which the frame 40 (inner case 39) is attached to the heat dissipation plate 31 on which the circuit board 12 is arranged, the partition wall 50 surrounds the three coils 20 all together and separates the installation region on the circuit board 12 on which the three coils 20 are installed from a region around the installation region. The two reinforcing portions 53 are each provided at the upper end of the partition wall 50 and arranged between the adjacent coils 20 (see FIG. 7).

Shielding Cover 60

The shielding cover 60 covers the upper side of the frame 40 (inner case 39). The shielding cover 60 is formed by punching or bending a galvanized steel plate (made of metal), for example, into a substantially rectangular parallelepiped box shape in which one side is open, and includes a top plate portion 61, and four cover-side walls 62 extending downward from the edge of the top plate portion 61.

Both end portions in the left-right direction of a cover front wall 62A of the four coverside walls 62 that is located on the font side, and both end portions in the left-right direction of a cover rear wall 62B of the four coverside walls 62 that is located on the rear side are provided with a total of four cover-side fixation pieces 63 extending outward from the lower edges of the cover front wall 62A and the cover rear wall 62B in the front-rear direction (vertical direction in FIG. 3). Coverside fixation holes 64 to be placed on the above-described heat dissipation plate-side fixation holes 34 penetrate the cover-side fixation pieces 63 (see FIGS. 1 to 3).

When the cover-side fixation holes 64 are placed on the heat dissipation plate-side fixation holes 34, and bolts (not shown) are fastened therethrough, the heat dissipation plate 31 and the shielding cover 60 are electrically connected to each other and integrally fixed to each other.

A coverside rib 66 having an annular shape to be fitted into the frame-side groove 46 protrudes downward from a portion on the lower side of the top plate portion 61 that corresponds to the frame-side groove 46 of the frame 40 (see FIG. 4).

A cutout portion 67 through which the connector hood portion 42A provided on the frame 40 passes is formed by cutting a portion located at a position corresponding to the connector portion 42 upward from the lower edge substantially into a U-shape.

Method for Manufacturing Electrical Junction Box 10

Next, an example of a method for manufacturing the electrical junction box 10 of this embodiment will be described. First, a printed circuit (not shown) is printed on the obverse side of the insulated board (on the installation surface 12A side of the circuit board 12) through printed wiring, and a plurality of busbars are arranged on the reverse side in a predetermined pattern and bonded thereto.

Next, the coils 20 and the other electronic components are placed at predetermined positions on the obverse side of the board (the installation surface 12A of the circuit board 12), and are connected to the printed circuit located on the obverse side and the busbars 15 located on the reverse side through reflow soldering. The circuit board 12 on which the electronic components including the coils 20 are installed is thus completed.

Next, the circuit board 12 is positioned on the upper side of the heat dissipation plate 31 via an adhesive insulating sheet (not shown) and fixed thereto.

Subsequently, the frame 40 (inner case 39) is placed on the heat dissipation plate 31. Thus, the positioning protrusions 43 of the frame 40 are fitted into the positioning holes 32 of the heat dissipation plate 31, and the frame-side rib 45 is fitted into the heat dissipation plate-side groove 35 (see FIG. 4). As a result, the heat dissipation plate 31 and the frame 40 are positioned relative to each other. At the same time, the circuit board 12 fixed at a predetermined position on the heat dissipation plate 31 and the frame 40, that is, the circuit board 12 and the partition wall 50 are positioned relative to each other (see FIGS. 6 and 7).

In this state, the partition wall 50 surrounds the three coils 20 all together, and separates the installation region on the circuit board 12 on which the three coils 20 are installed from a region around the installation region. In addition, the upper end of the partition wall 50 is located at a position that is slightly higher than the upper sides of the coils 20. It should be noted that, at this time, the lower edge of the partition wall 50 may be located slightly above the installation surface 12A of the circuit board 12 (see FIG. 4).

Next, a potting material 55 (an example of a synthetic resin material) is provided in the space inward of the partition wall 50. The potting material 55 is provided such that its height is about a half of the height of the partition wall 50. The coils 20, the circuit board 12, and the partition wall 50 are integrated using the potting material 55. As a result, the circuit assembly 11 in which the coils 20 are firmly held by the potting material 55 in the space inward of the partition wall 50 on the circuit board 12 is obtained. Specifically, the coils 20 are held in a state in which it does not move relative to the circuit board 12.

It should be noted that the potting material 55 preferably has such a viscosity that the potting material 55 does not leak through any minute clearance between the partition wall 50 and the circuit board 12 when provided in the space inward of the partition wall 50.

Next, the shielding cover 60 is put on the frame 40 (inner case 39) from above, and the circuit assembly 11 is thus covered with the shielding cover 60.

Figure 2:
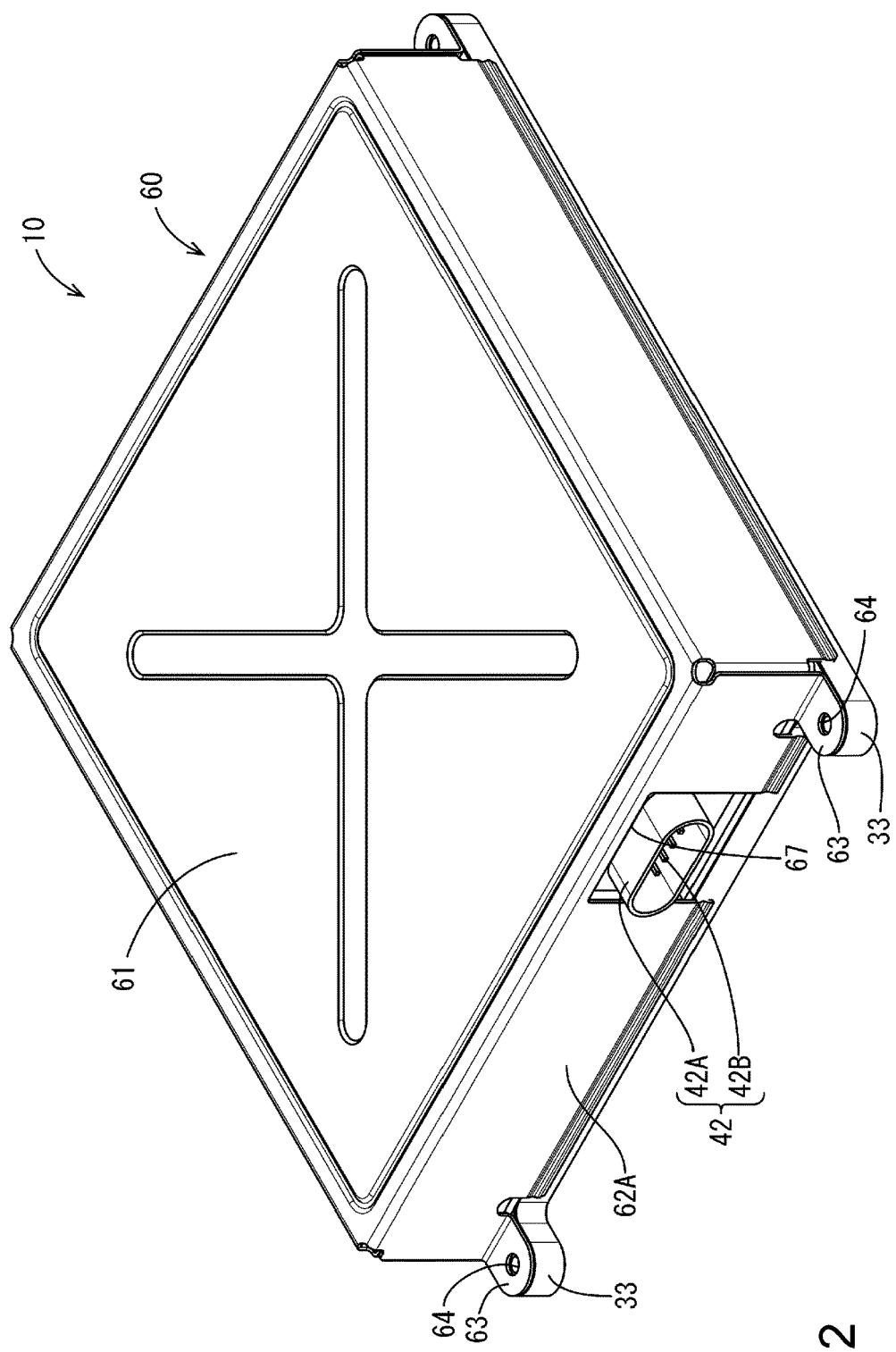
FIG. 2 is a perspective view of the electrical junction box.

Thus, the cover-side rib 66 is fitted into the frame-side groove 46, and the cover-side fixation holes 64 are placed on the heat dissipation plate-side fixation holes 34. In addition, as shown in FIG. 2, the connector hood portion 42A protrudes through the cutout portion 67 of the shielding cover 60.

Thereafter, bolts (not shown) are passed through the cover-side fixation holes 64 and fastened to the heat dissipation plate-side fixation holes 34, and the shielding cover 60 and the heat dissipation plate 31 are fixed relative to each other. The electrical junction box 10 is thus completed.

Functions and Effects of this Embodiment

With the above-described electrical junction box 10 of this embodiment, the coils 20 are firmly fixed to the circuit board 12 since the coils 20 are surrounded by the partition wall 50, and portions of the coils 20 are embedded in the potting material 55 provided in the space inward of the partition wall 50 and integrated with the circuit board 12 and the partition wall 50. That is, unlike the conventional case, a region for the fixation of a screw need not be provided on the board, and a conductive circuit can be arranged in a region around the coils 20 because stress caused by a fastening force is not applied to regions around the fixation portions (portions to which a screw is fixed), thus making it possible to increase the wiring density. As a result, the circuit board 12 can be reduced in size, and the circuit assembly 11 and the electrical junction box 10 can be thus reduced in size.

In addition, the frame 40 and the partition wall 50 are formed in one piece with the inner case 39, and therefore, the partition wall 50 is automatically positioned relative to the circuit board 12 by assembling the inner case 39 (frame 40) at a predetermined position. In addition, the number of components can be reduced, and the manufacturing operation can be easily performed since it is merely required to provide the potting material 55 in the space inward of the partition wall 50.

Furthermore, heat generated by the coils 20 is immediately transferred to not only the heat dissipation plate 31 but also the frame 40 via the potting material 55 and dissipated toward the outside. Therefore, an excellent heat dissipating property can be achieved compared with a configuration in which heat is dissipated using only the heat dissipation plate 31.

Embodiment 2

Figure 11:
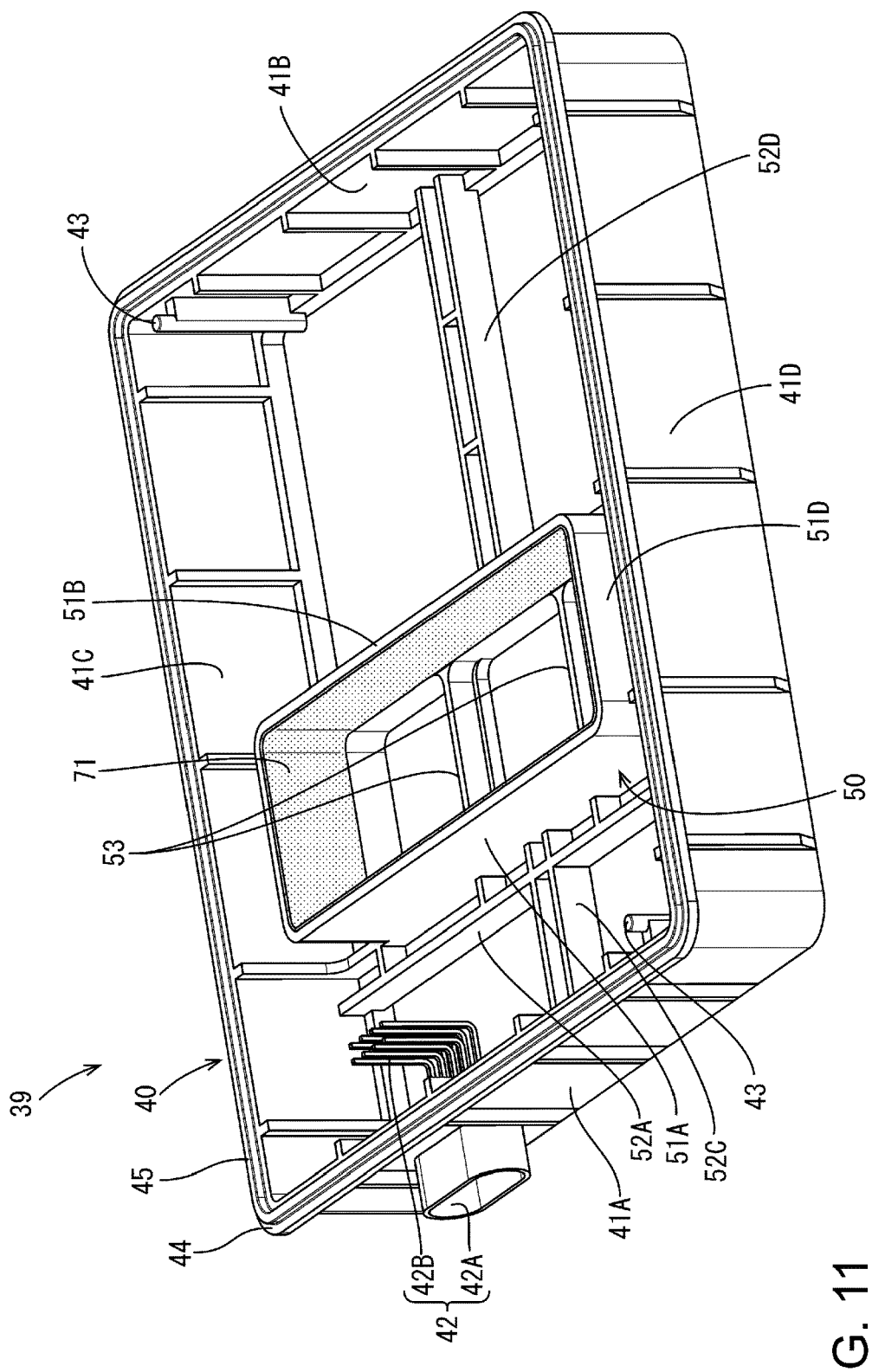
FIG. 11 is a perspective view showing a lower side of an inner case of Embodiment 2.

Next, Embodiment 2 will be described with reference to FIG. 11. An electrical junction box of this embodiment is an electrical junction box obtained by providing a shielding layer in the above-described electrical junction box 10 of Embodiment 1. Configurations similar to those in Embodiment 1 are denoted by the same reference numerals.

In the electrical junction box of Embodiment 2, general-purpose aluminum tape 71 (an example of the shielding layer) is bonded to the interior side of the partition wall 50. With this configuration, portions of the magnetic fields generated by the coils 20 can be blocked by the aluminum tape 71, thus making it possible to suppress the influences of the magnetic fields on the electronic components arranged around the coils 20.

Embodiment 3

Figure 12:
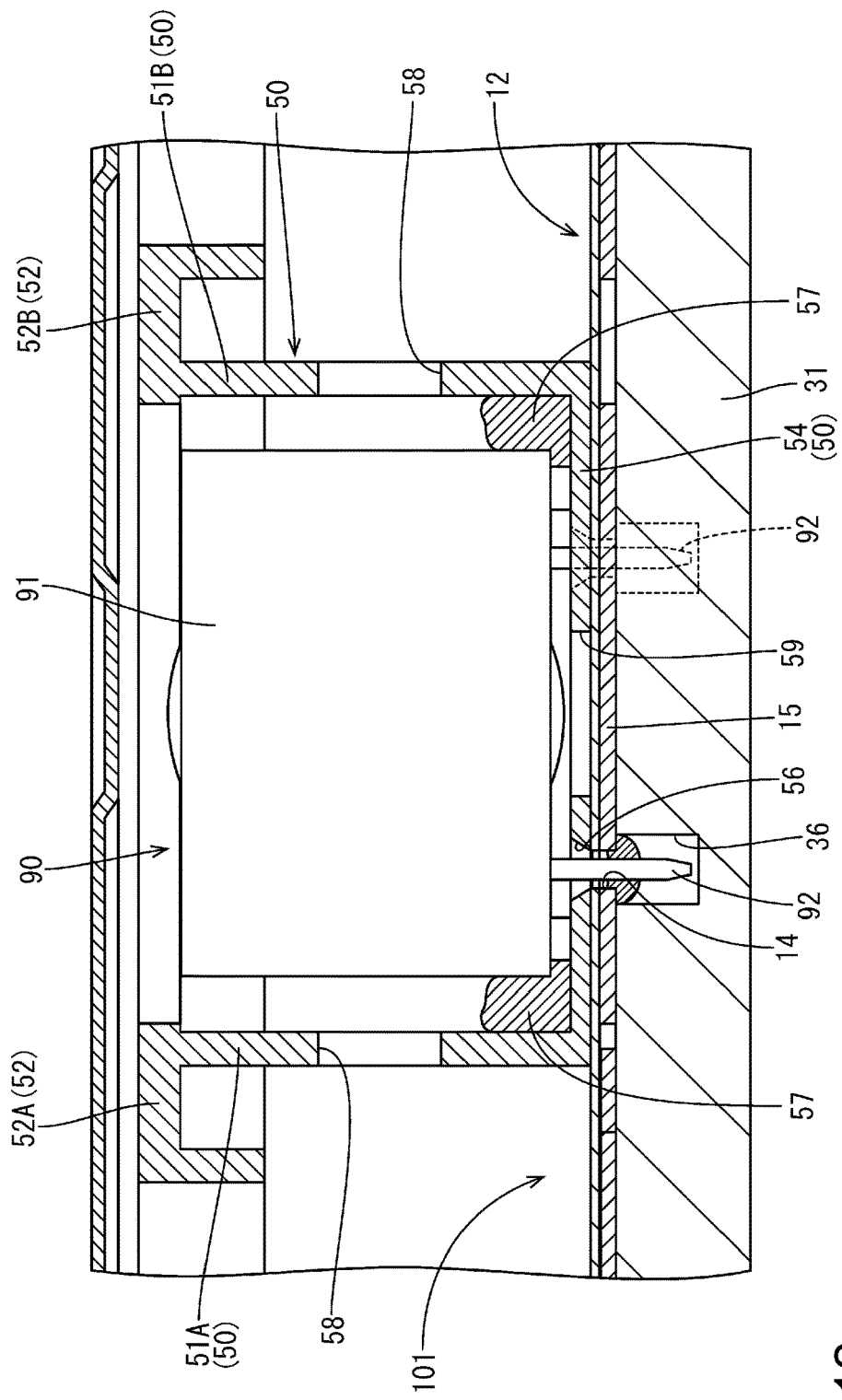
FIG. 12 is a partially enlarged cross-sectional view of an electrical junction box of Embodiment 3.

Next, Embodiment 3 will be described with reference to FIG. 12. It should be noted that, hereinafter, only the differences between the configurations of this embodiment and the configurations of Embodiment 1 will be described, configurations similar to those in Embodiment 1 are denoted by the same reference numerals, and redundant descriptions are omitted.

Each coil 90 of this embodiment includes a lead-type connection portion 92 (terminal) protruding straight toward the circuit board 12 from the bottom surface of a main body 91. Moreover, this embodiment differs from the above-mentioned embodiments in that a bottom wall 54 to be placed on the circuit board 12 is formed in one piece with the wall portions 51 in the space inward of the partition wall 50 (wall portions 51).

Insertion holes 56 into which the connection portions 92 of the coils 90 are inserted are formed at predetermined positions of the bottom wall 54. The insertion holes 56 have a shape in which the diameter increases toward the space inward of the partition wall 50 (toward the coil 90 side).

The coils 90 are placed at predetermined positions on the bottom wall 54 in a state in which the connection portions 92 are inserted into the insertion holes 56, and are bonded to portions of the bottom wall 54 and the wall portions 51 using an adhesive 57 (an example of the synthetic resin material). The coils 90 are thus fixed in the space inward of the partition wall 50.

First heat dissipation holes 58 for dissipating heat generated by the coils 90 are formed in the central portions in the vertical direction of the wall portions 51. In addition, second heat dissipation holes 59 are formed in portions of the bottom wall 54 located at positions corresponding to the main bodies 91 of the coils 90 for the same purpose of dissipating heat generated by the coils 90. Heat does not stay in the space inward of the partition wall 50 due to the first heat dissipation holes 58 and the second heat dissipation holes 59.

Insertion holes 14 into which the connection portions 92 of the coils 90 are inserted are formed at predetermined positions of the circuit board 12 (the insulated board and the busbars 15). The connection portions 22 are inserted into the insertion holes 56 of the bottom wall 54 and the insertion holes 14 of the circuit board 12 and soldered from the busbar 15 side, and the coils 90 are thus electrically connected to the circuit board 12.

Furthermore, recesses 96 in which the connection portions 92 are provided are formed in portions of the heat dissipation plate 31 located at positions corresponding to the connection portions 92 of the coils 90 in a state in which the circuit board 12 is placed on the heat dissipation plate 31.

With a circuit assembly 101 of this embodiment, a plurality of coils 90 can be arranged on the circuit board 12 all together in a state in which the coils 90 are fixed to predetermined positions in the space inward of the partition wall 50 in advance.

It should be noted that, in this embodiment, the coils 90 are positioned relative to the partition wall 50 using the adhesive 57 and the partition wall 50 is positioned relative to the circuit board 12 in the same manner as in Embodiment 1 above, and therefore, the coils 90 are positioned relative to the circuit board 12 via the partition wall 50 and the frame 40 and are firmly fixed.

Other Embodiments

The technology disclosed in this specification is not limited to the embodiments that have been described above with reference to the drawings, and embodiments such as those described below are also included in the technical scope.

(1) The coil elements are not limited to those in the above-mentioned embodiments, and the technology disclosed in this specification can also be applied to cases where relays or transformers including coils are used.

(2) When coils of a surface installation type are used, coils having a configuration in which a connection portion is fixed to a busbar using a screw can also be used.

(3) Although the outer case 30 includes the heat dissipation plate 31 made of metal, the inner case 39 including the substantially rectangular frame-shaped frame 40 (an example of the frame member) for surrounding the circuit board 12, and the shielding cover 60 in the above-mentioned embodiments, the heat dissipation plate 31 need not be necessarily included, and a lower case made of resin may also be used.

(4) Although the shielding cover 60 made of metal is used as a cover in the above-mentioned embodiments, a cover made of a synthetic resin may also be used instead of the shielding cover 60.

Figure 13:
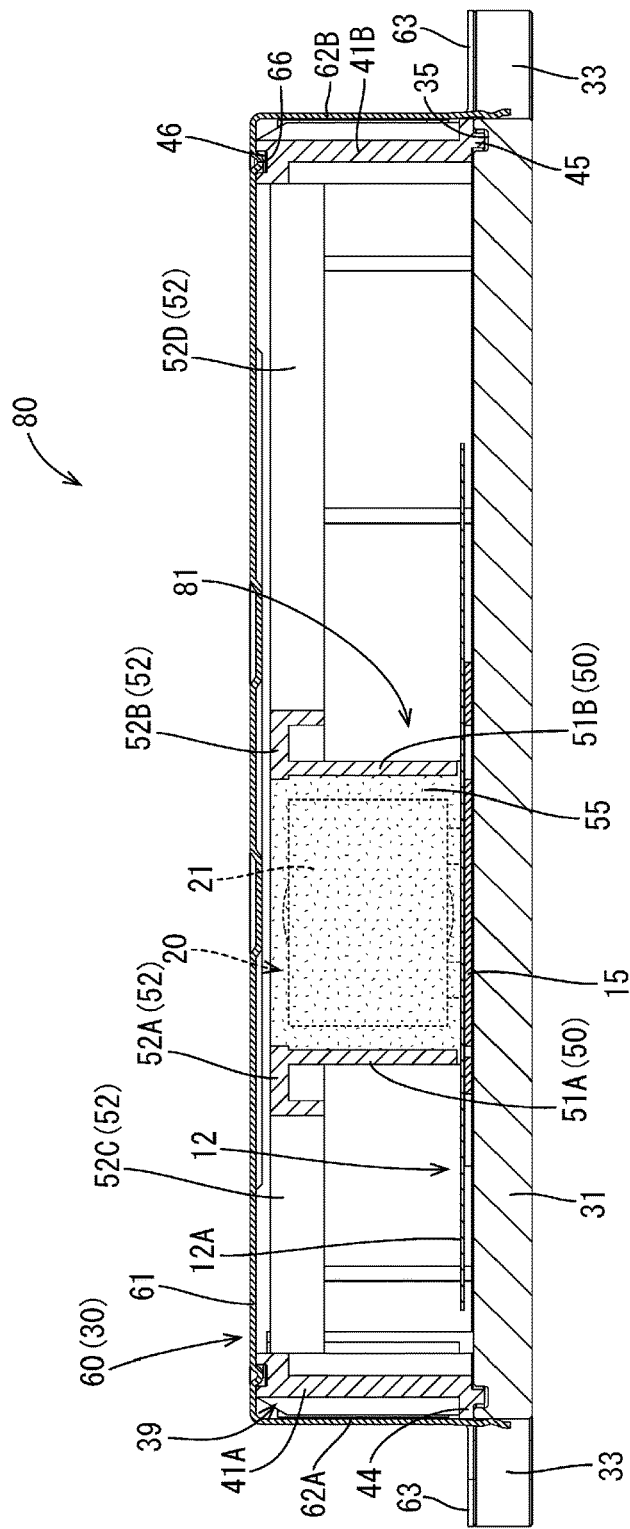
FIG. 13 is a cross-sectional view of an electrical junction box of another embodiment.

(5) Although a configuration in which the potting material 55 is provided such that its height is about a half of the height of the partition wall 50 is shown in the above-mentioned Embodiment 1, a circuit assembly 81 and an electrical junction box 80 may also be formed in which the potting material 55 is provided such that its height is equal to the height of the partition wall 50, and the entireties of the coils 20 are covered with the potting material (see FIG. 13). With such a configuration, the heat dissipating property can be further improved compared with the configuration in which only portions of the main bodies 21 are embedded in the potting material 55.

(6) Although a configuration in which a plurality of coils 20 are surrounded by the single partition wall 50 all together is shown in the above-mentioned embodiments, a configuration in which partition walls that separately surround the individual coils 20 are provided is also possible.

(7) Although a configuration in which the frame 40 and the partition wall 50 are formed in one piece with the inner case 39 is applied in the above-mentioned embodiments, a frame and a partition wall may also be formed separately.

(8) The potting material may contain magnetic metal powder. With this configuration, the magnetic fields generated by the coils 20 can be made less likely to leak to the outside of the partition wall 50.

(9) Although a configuration in which the shielding layer (aluminum tape 71) is provided on the interior side of the partition wall 50 is applied in the above-mentioned Embodiment 2, a configuration in which a shielding layer is provided on the outside of the partition wall 50 is also possible.

(10) Although a configuration in which the aluminum tape 71 is used as the shielding layer is applied in the above-mentioned Embodiment 2, the shielding layer is not limited to that in the above-mentioned embodiment, and a metal plate or the like may also be used.

(11) A configuration in which a shielding layer is also provided on the bottom wall 54 in addition to the partition wall 50 (wall portions 51) is also possible.

(12) When the coils are fixed to the partition wall using an adhesive, the positions at which the adhesive is provided are not limited to those in the above-mentioned Embodiment 3, and the adhesive may also be provided at any positions. For example, if the second heat dissipation holes 59 are not formed in Embodiment 3, a configuration in which the bottom surfaces of the main bodies 91 of the coils 90 are bonded to the bottom wall 54 is also possible. Alternatively, a configuration in which the lateral walls of the main bodies 91 are bonded to the wall portion 51 is also possible.

(13) Although a configuration in which the coils 20 and 90 are fixed to the partition wall 50 using one of the potting material 55 and the adhesive 57 is applied in the above-mentioned embodiments, a configuration in which the coils 20 and 90 are fixed using both the potting material 55 and the adhesive 57 is also possible.

(14) When heat dissipation holes are formed in the partition wall 50, the positions of the heat dissipation holes are not limited to those in the above-mentioned Embodiment 3, and the heat dissipation holes can be formed at any positions.

The invention claimed is:

1. An electrical junction box comprising:
a circuit board on which a coil element is installed;
a partition wall that surrounds the coil element and separates an installation region on the circuit board on which the coil element is installed from a region around the installation region;
a frame that is formed in one piece with the partition wall and surrounds the circuit board;
a heat dissipation plate on which the circuit board and the frame are placed; and
a cover that covers the circuit board from the frame side, wherein the coil element is fixed to the partition wall using a synthetic resin material, and
wherein the frame and the heat dissipation plate are positioned relative to each other through a recess-projection engagement, and the cover is fixed to the heat dissipation plate using screws.

2. The electrical junction box according to claim 1, wherein the synthetic resin material is an adhesive for bonding the coil element to the partition wall.

3. The electrical junction box according to claim 1, wherein the synthetic resin material is a potting material in which at least a portion of the coil element is embedded.

4. The electrical junction box according to claim 3, wherein an entirety of the coil element is embedded in the potting material.

5. The electrical junction box according to claim 3, wherein the potting material contains magnetic metal powder.

6. The electrical junction box according to claim 1, wherein the partition wall is provided with a shielding layer.

7. The electrical junction box according to claim 1, wherein a plurality of the coil elements are installed on the circuit board, and the partition wall surrounds the plurality of the coil elements all together in a state in which gaps are formed at least between the plurality of the coil elements.

8. The electrical junction box according to claim 1, wherein a bottom wall placed on the circuit board in a space inward of the partition wall is formed in one piece with the partition wall.

* * * * *